United States Patent
Kouchachvili et al.

(10) Patent No.: US 7,323,506 B2
(45) Date of Patent: Jan. 29, 2008

(54) HIGH PERFORMANCE P(VDF-TRFE) COPOLYMER FOR PYROELECTRIC CONVERSION

(75) Inventors: Lia Kouchachvili, Ottawa (CA); Michio Ikura, Ottawa (CA)

(73) Assignee: Natural Resources Canada, Ottawa (CA)

( * ) Notice: Subject to any disclaimer, the term of this patent is extended or adjusted under 35 U.S.C. 154(b) by 384 days.

(21) Appl. No.: 11/001,705

(22) Filed: Dec. 2, 2004

(65) Prior Publication Data

US 2006/0122299 A1    Jun. 8, 2006

(51) Int. Cl.
*C08K 5/07* (2006.01)

(52) U.S. Cl. .......... 524/356; 524/1; 524/544; 524/545; 528/480; 528/481; 528/502

(58) Field of Classification Search ............ 524/356, 524/1, 544, 545; 528/480, 481, 502
See application file for complete search history.

(56) References Cited

U.S. PATENT DOCUMENTS

| | | | |
|---|---|---|---|
| 2,866,721 A | 12/1958 | Hetherington et al. | |
| 3,193,539 A | 7/1965 | Hauptschein | |
| 3,441,531 A * | 4/1969 | Koblitz | 524/156 |
| 3,833,503 A | 9/1974 | Murayama et al. | |
| 4,173,033 A | 10/1979 | Sako et al. | |
| 4,268,653 A | 5/1981 | Uchidoi et al. | |
| 4,620,262 A | 10/1986 | Olsen | |
| 4,845,193 A * | 7/1989 | Umemura et al. | 528/487 |
| 4,946,913 A | 8/1990 | Kappler | |
| 5,140,082 A | 8/1992 | Watanabe et al. | |
| 5,153,859 A | 10/1992 | Chatigny et al. | |
| 6,528,898 B1 | 3/2003 | Ikura et al. | |
| 6,605,246 B2 | 8/2003 | Zhang et al. | |
| 6,713,563 B2 | 3/2004 | Roland et al. | |
| 6,790,932 B2 * | 9/2004 | Kapeliouchko et al. | 528/480 |
| 7,015,368 B2 * | 3/2006 | Wu et al. | 570/177 |

FOREIGN PATENT DOCUMENTS

| | | |
|---|---|---|
| EP | 1568719 A1 | 8/2005 |
| GB | 2184737 A | 7/1987 |

OTHER PUBLICATIONS

Olsen, R.B. et al., "Pyroelectric Conversion Cycle of Vinylidene Fluoride-Trifluoroethylene Copolymer," Journal of Applied Physics, vol. 57 (No. 11), (1985).

(Continued)

*Primary Examiner*—Peter D. Mulcahy
*Assistant Examiner*—Henry S. Hu
(74) *Attorney, Agent, or Firm*—Jones, Tullar & Cooper, P.C.

(57) ABSTRACT

A process for purifying a P(VDF-TrFE) copolymer to produce an improved high performance copolymer for pyroelectric conversion. Pellets of a P(VDF-TrFE) copolymer are dissolved in a solvent to form a solution. Subsequently, anhydrous ethanol is added to the solution to initiate copolymer gel precipitation, after which the solution is separated to obtain the gel precipitate, which is subsequently washed and dried. The resulting copolymer has fewer impurities and higher resistivity, thereby being suitable for use in applications such as pyroelectric converters. The purified copolymer also exhibits phase transition characteristics that allow for increased power output.

7 Claims, 3 Drawing Sheets

OTHER PUBLICATIONS

Chan, H.L.W. et al., "Thermal Hysteresis in the Resistivity of P(VDF-TrFE) Copolymers," Ferroelectrics, p. 141-146, (1997).

Ikura, M., Jian-Lin, "Conversion of Waste Heat to Electricity Using a High Performance Pyroelectric Converter," Energy and Environment—A World of Challenges and Opportunities, Proc. EnerEnv 2003 Conference (China), (Oct. 14, 2003).

El-Hami, Khalil and Matsushige, Kazumi, "Reduction and Separation of Carbon Nanotube Bundles Using the P0VDF-TrFE) Copolymer: Nanobundles," Journal of Composite Materials. vol. 38 (No. 16). (Aug. 2004).

Kim, Kap Jin and Kim, Bum Gwan, "Curie Transition, Ferroelectric Crystal Structure and Ferroelectricity of a VDF/TrFE (75/25) Copolymer: the Effect of Poling on Curie Transition and Ferroelectric Crystal Structure," Polymer, p. 4881-4889, (1997).

Bongianni, W.L., "Effect of Crystallization and Annealing on Thin Films of Vilylidene Fluoride/Trifluoroethylene (VF2/F3E) Copolymers," Ferroelectrics, p. 57-62, (1990).

Moriera, Roberto Luiz et al., "Thermal and Dielectric Investigations of the Curie Transition in Poly (Vinylidene Fluoride Trifluoroethylene Copolymers," Phase Transitions, p. 243-249, (1989).

Gregorio, Rinaldo Jr. and Botta, Marcelo Marino, "Effect of Crystallization Temperature on The Phase Transition of P(VDF/TrFE) Copolymers," Journal of Polymer Science Part B: Polymer Physics, p. 403-414, (1998).

Olsen, et al, Pyroelectric Conversion Cycle of Vinylidene Fluoride-Trifluoroethylene Copolymer, J. App. Phys., Jun. 1, 1985, pp. 5036-5042, vol. 57, issue 11, Am. Inst. of Phys.

El-Hami, et al, Nanoscopic Measurements of the Electrostriction Responses in P (VDF/TrFE) . . . , Appl. Phys. A, 2001, pp. 347-350, vol. 72, No. 3, Digital Object Identifier.

El-Hami and K. Matsushige, Lamellae Orientation Effect on Local Polarized Domain . . . , J. App. Polymer Science, 2005, pp. 1410-1413, vol. 96, No. 4, Wiley Periodicals, Inc.

El-Hami and K. Matsushige, Covering Single Walled Carbon nanotubes by the Poly . . . , Chem. Physics Letters, 2003, pp. 168-171, vol. 368, Elsevier Science B.V.

* cited by examiner

HIGH PERFORMANCE P(VDF-TRFE) COPOLYMER FOR PYROELECTRIC CONVERSION

FIELD OF THE INVENTION

The present invention relates to a process for producing a high performance poly-vinylidene fluoride trifluoroethylene P(VDF-TrFE) copolymer for pyroelectric conversion.

BACKGROUND OF THE INVENTION

Pyroelectric conversion is a conversion of heat to electricity due to properties of particular materials that become electrically polar when heated, resulting in opposite charges of static electricity within the material, i.e. the material exhibits an electric polarity. The technology is relatively new and is not yet commercially available.

A vinylidene fluoride trifluoroethylene copolymer is one such pyroelectric material. An example of the use of such a pyroelectric material is set out in U.S. Pat. No. 6,528,898 B1.

When a P(VDF-TrFE) copolymer is used for converting heat to electricity, the phase transition temperature at which polarization and depolarization occurs is a function of copolymer temperature. The phase transition temperature also increases with increased electric field on the copolymer. Thus, the power conversion process generally requires the synchronization of copolymer temperature and applied electric field. However, when commercial P(VDF-TrFE) copolymer is used for power conversion, substantial power losses occur due to internal leakage at high temperature and high voltage, resulting in increased internal conduction losses during pyroelectric conversion. The only known solution for minimization of the leakage current is a reduction of the electric field on the copolymer. However, reducing the electric field seriously limits the final net power output by restricting a voltage differential needed during power conversion.

This decrease in electrical resistivity of P(VDF-TrFE) copolymers with increasing temperature has been documented before. For instance, Olsen, R. B. et al. (*Pyroelectric conversion cycle of vinylidene fluoride-trifluoroethylene copolymer,* Journal of Applied Physics, Vol. 57, No. 11, p. 5036, 1985) report that the electrical conduction losses in P(VDF-TrFE) films during energy conversion became unacceptably large at high temperature. Chan, H. L. W. et al. (*Thermal hysteresis in the resistivity of P(VDF-TrFE) copolymers,* Ferroelectrics, Vol. 196, pp. 141-146; 1997) also report that as temperature increases from 20° C. to 140° C., the resistivity of the copolymer decreases from roughly $10^{14}$ Ωm to $10^8$ Ωm. Neither publication discusses any solution to this problem.

There are several known methods for the preparation of a P(VDF-TrFE) copolymer that generally employ the evaporation of a solvent. For example, U.S. Pat. No. 3,833,503 teaches a process of producing a stable pyroelectric element composed of a vinylidene fluoride resin. A solution of vinylidene fluoride resin is dissolved in a solvent at a temperature higher than the crystal melting point of the resin and the solvent is removed by heating or pressure reduction.

U.S. Pat. No. 4,173,033 teaches a polymeric dielectric composition of a copolymer of vinylidene fluoride and trifluoroethylene. Trifluoroethylene and vinylidene fluoride are charged into a pressure resistant reaction vessel having trifluorotrichloroethane and di-(3,5,6-trichloroperfluorohexanoyl) peroxide maintained below 0° C. The reaction vessel is immersed into a water tank of 20° C., whereby the polymerization is initiated. A vinylidene fluoride-trifluoroethylene copolymer is recovered as a white clump, which is pulverized in water by the aid of a mixer and dried to produce fine granules.

U.S. Pat. No. 6,605,246 teaches an electrical device that includes a layer of processed ferroelectric polyvinylidene fluoride polymer. Preparation of the polymer film is effected by a melt pressing method or a solution casting method that involves dissolving P(VDF-TrFE) in methyl ethyl ketone and heating the solution to evaporate the solvent.

U.S. Pat. No. 3,193,539, *Process for Polymerizing Vinylidene Fluoride,* issued on Jul. 6, 1965, discloses a process for polymerizing vinylidene fluoride involving charging an autoclave with water and a catalyst prior to introducing vinylidene fluoride. After sealing and shaking the mixture, the autoclave is cooled, vented and opened. The contents consist of precipitated polyvinylidene fluoride suspended in a liquid phase, which is subsequently filtered and washed with methanol.

El-Hami, Khalil and Matsushige, Kazumi (*Reduction and Separation of Carbon Nanotube Bundles using the P(YDF-TrFE) Copolymer: Nanobundles,* Journal of Composite Materials, Vol. 38, No. 16, August 2004) disclose a process to improve the assembly of single-walled carbon nanotubes (SWCNTs) through preparation of a nanocomposite matrix by mixing SWCNT and P(VDF-TrFE) copolymer. The SWCNT is dispersed in ethanol while the P(VDF-TrFE) copolymer is dissolved in methyl ethyl ketone. The two solutions are mixed together to form a homogeneous solution.

SUMMARY OF THE INVENTION

One aspect of the present invention relates to a process for purifying a P(VDF-TrFE) copolymer by obtaining pellets of a P(VDF-TrFE) copolymer and dissolving the pellets in a solvent to form a solution. Anhydrous ethanol is added to the solution to initiate copolymer gel precipitation. The solution and the gel precipitate are separated and the gel precipitate is washed and dried. The resulting copolymer can be used, for example, as a pyroelectric material or in an apparatus for converting heat to electricity.

Another aspect of the present invention is a high performance copolymer utilized in converting heat to electricity that addresses the problem of substantial power loss due to internal leakage at high temperatures and voltages. Impurities in the copolymer are removed by solvent extraction. The process involves dissolving pellets of P(VDF-TrFE) copolymer in methyl ethyl ketone after which anhydrous ethanol is added to extract impurities from the solvated P(VDF-TrFE) and to initiate copolymer gel precipitation. The gel is separated from the solvent by filtration and subsequently washed with ethanol, after which air-drying occurs. The resulting high performance copolymer has fewer impurities and improved resistivity and pyroelectric characteristics.

It has been unexpectedly found that the process of the present invention removes approximately 0.4 wt % of un-identifiable 'impurities', yet the procedure substantially enhances electrical and pyroelectric properties. It was discovered that the electrical resistivity of the purified copolymer is approximately 35% higher than that of an unpurified copolymer. The pyroelectric conversion can therefore be operated at a significantly higher voltage and at a higher temperature without developing a large leakage current.

BRIEF DESCRIPTION OF THE DRAWINGS

The following description of the present invention will be more fully understood with reference to the drawings in which.

DESCRIPTION OF THE PREFERRED EMBODIMENTS

The present invention modifies commercial P(VDF-TrFE) and produces a high performance copolymer that has particular application to pyroelectric conversion. The copolymer of P(VDF-TrFE) is purified of unknown impurities, thereby improving the performance of the copolymer under severe operating conditions.

In the preferred embodiment, pellets of a commercially available 60%-40% P (VDF-TrFE) copolymer are dissolved in methyl ethyl ketone (MEK) to produce about a 4% solution by weight. After the pellets are dissolved, anhydrous ethanol (EtOH) is added to the homogeneous solution. This procedure results in copolymer gel precipitation. The gel is separated from the solvent (MEK/EtOH) by filtration using a filter paper. Subsequently the gel is washed with ethanol. The purified gel (copolymer) is then air-dried in an oven at 50° C. for 3 h, and further air-dried at room temperature for three days.

It was found that solvent extraction removes approximately 0.4 wt % of un-identifiable 'impurities'. Although the amount removed appears small, the electrical resistivity of the purified copolymer is approximately 35% higher than that of unpurified copolymer. Thus, the pyroelectric conversion can be operated at a significantly higher voltage and at a higher temperature without developing a large leakage current. Tests show that the upper limit of the electric field can be increased by about 33% to contribute to the higher net power output. Purification in itself also significantly increases the net power output nearly three-fold from 95 J/L of copolymer used to 279 J/L of copolymer used.

Figure 1:
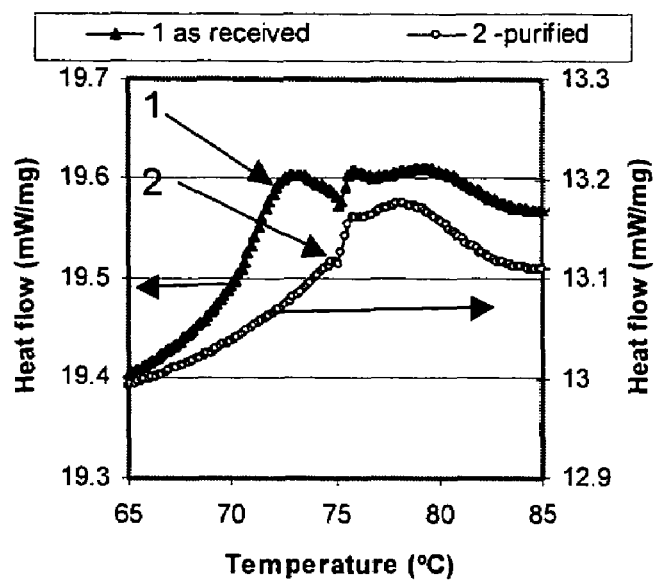
FIG. 1 is a graph of differential scanning calorimeter (DSC) thermograms for ferroelectric to paraelectric phase transition comparing purified and unpurified copolymers.
Figure 2:
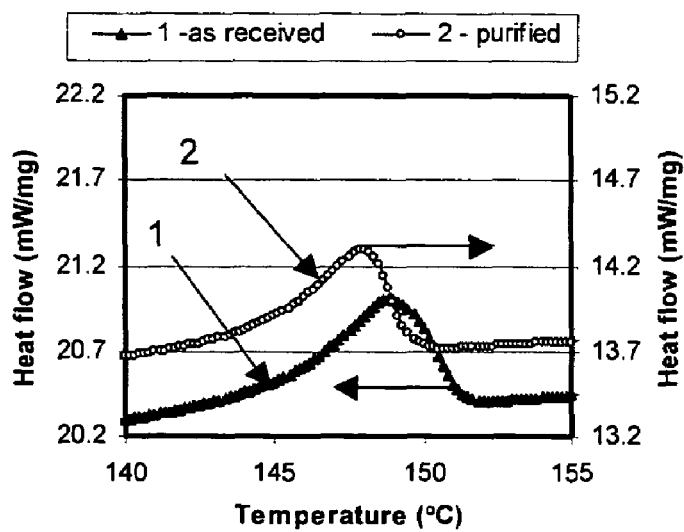
FIG. 2 is a graph of DSC thermograms for melting temperature comparing purified and unpurified copolymers.

In one type of test, a differential scanning calorimeter (DSC) was used to compare purified and unpurified materials resulting in unexpected differences in phase transition peaks. FIGS. 1 and 2 compare DSC data for two samples: purified and unpurified (or as received) samples. These samples were not annealed and the DSC test was performed at 10° C./min. FIG. 1 illustrates the DSC thermograms for ferroelectric to paraelectric phase transition and FIG. 2 illustrates the DSC thermograms for melting temperature. It can be seen that the thermal analysis of purified and unpurified materials have different phase transitions. Ferro-electric to para-electric transition after purification exhibits only one peak, while unpurified material has two, which corresponds to a mix of highly polar β phases with other non-polar phases. These non-polar phases disappear after purification and the interval of the transition becomes wider, while corresponding amounts of enthalpy of dipole contribution increases. These changes improve the pyroelectric properties of the material. The increase in the polarity corresponds to the increase in capacitance, i.e., ability to hold electric charge.

Figure 3:
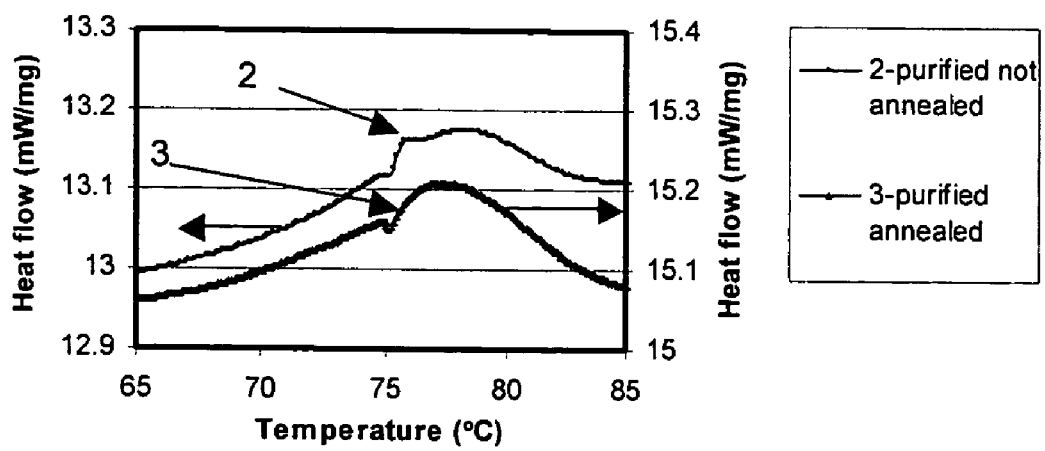
FIG. 3 is a graph of DSC thermograms for ferroelectric to paraelectric phase transition comparing purified and annealed versus purified but non-annealed copolymers.
Figure 4:
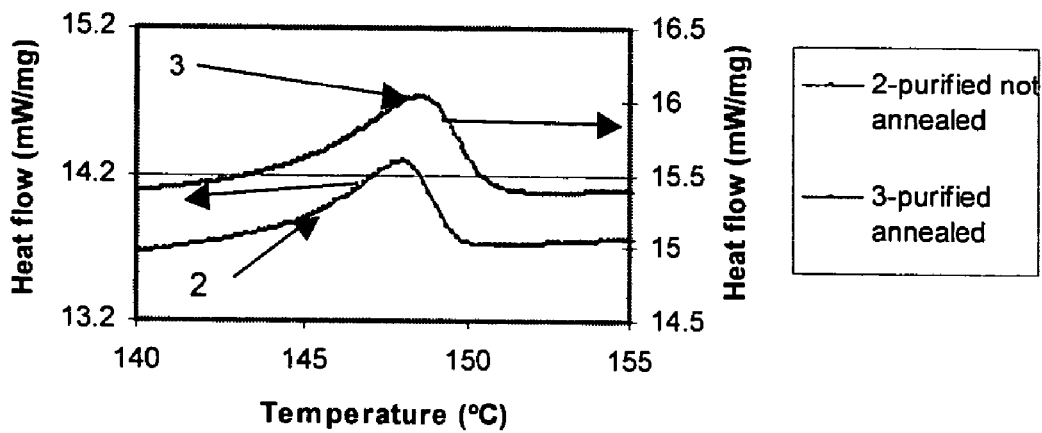
FIG. 4 is a graph of DSC thermograms for melting temperature comparing purified annealed and purified non-annealed copolymers.

FIG. 3 shows a comparison of the DSC thermograms for ferroelectric to paraelectric phase transition comparing purified and annealed copolymer versus purified but non-annealed. After the purified film has been annealed, the shift of the ferroelectric to paraelectric peaks is not very significant. FIG. 4 shows a comparison of the DSC thermograms for melting temperature of annealed and non-annealed purified copolymers. Upon review of the non-annealed results of FIG. 1, there is only one phase transition peak at about 78° C. for the purified copolymer. Thus, the purified non-annealed P(VDF-TrFE) has a transition temperature approximately 10° C. higher than that of the unpurified copolymer and slightly higher than that of the annealed purified copolymer.

To summarize the test results of FIGS. 1 to 4, ferro-electric (polar) to para-electric (non-polar) transition in purified material show only one peak whereas unpurified material has two. The total area of two peaks in the unpurified copolymer corresponding to a simple phase transition plus ferroelectric transition is more than that of the single peak in the purified material. However, the output from the purified material was much higher than that from the unpurified material. The two peaks in the unpurified copolymer overlap. Resolving or separating the peaks with a mathematical method results in the observation that the dielectric contribution from the polar peak in the unpurified material is small. Conversely, the area of the single peak in the purified material is broader than the polar peak in the unpurified material.

Ferroelectrics that have a higher Curie transition point also have more trans sequences (polar) and less gauche (non-polar). Table 1 summarizes enthalpies and entropies at phase transition temperatures and melting temperatures for these different samples.

TABLE 1

Thermodynamic properties of as received, as received but annealed, purified, and purified and annealed P (VDF-TrFE)

| | Transition | | | Melting | | |
|---|---|---|---|---|---|---|
| Sample | Temperature (K) | Enthalpy (J/g) $\Delta H_T$ | Entropy (J/gK) $\Delta S_D$ | Temperature (K) | Enthalpy (J/g) $\Delta H_m$ | Entropy (J/gK) $\Delta S_m$ |
| As received | 343 | 3.87 | 0.011 | 417 | 18.9 | 0.45 |
| As received, annealed | 340 | 4.59 | 0.014 | 421 | 22.1 | 0.52 |
| Purified | 348 | 5.07 | 0.015 | 417 | 17.7 | 0.04 |
| Purified, annealed | 340 | 7.08 | 0.021 | 417 | 20.8 | 0.05 |

The purified copolymer shows a significant increase in electrical resistivity and an improved ferro-electric to para-electric phase transition response. Furthermore, the purified material is significantly easier to precondition (pre-polarize) prior to pyroelectric conversion. The resulting high performance copolymer allows operation of pyroelectric conversion at significantly more severe process conditions. Consequently, the net power output is increased substantially over commercial copolymers by reducing internal leakage current and also by changing the pyroelectric response, i.e., heat-to-electrical charge response.

Proper pre-polarization and high resistivity are key factors for superior pyroelectric materials that achieve high pyroelectric conversion efficiency. High film resistivity minimizes the internal conductive current, resulting in a higher net power output. It was discovered that purified P(VDF-TrFE) is easier to pre-polarize and eliminates instances of short-circuiting during film pre-polarization. Purified P(VDF-TrFE) films show a significant increase in resistivity and an increase in the available electron discharge across the phase transition temperature, while the time required for complete pre-polarization decreases. The purified copolymer surprisingly exhibited an increased net power output from 95 J/L copolymer used to 279 J/L of the copolymer used.

Figure 5:
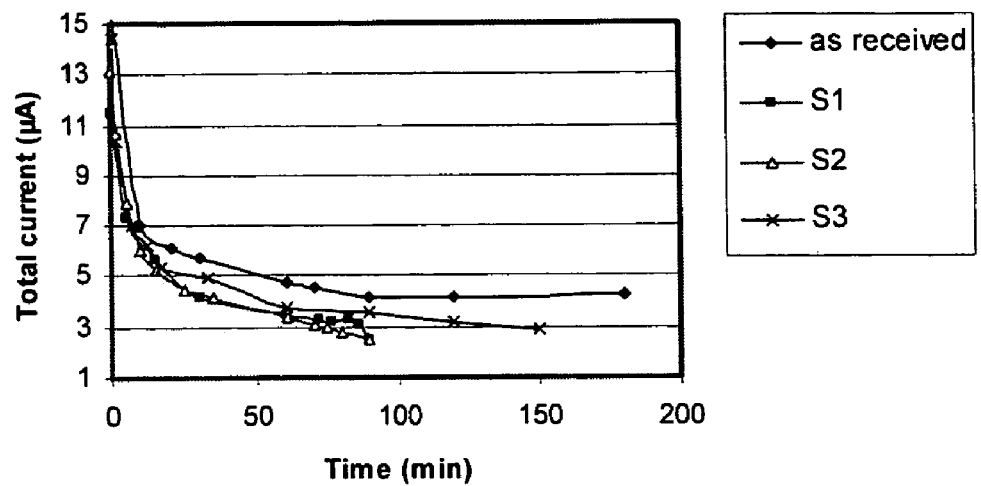
FIG. 5 is a graph of the effect of purification on pre-polarization procedure of unpurified and three samples of purified copolymers.

FIG. 5 compares pre-polarization time for unpurified or as received P(VDF-TrFE) and purified P(VDF-TrFE) samples according to the present invention; S1, S2 and S3. The tests were performed at 85° C. with a 20 MV/m applied electric field. The vertical axis that is labelled "total current" represents the leakage current. FIG. 5 shows a significant decrease in the total current during the first 10 to 15 min. After about 90 min of pre-polarization, the decrease in the total current for unpurified material has nearly ceased, whereas the total current continues to decrease for the other three purified copolymer samples.

When an electric field is applied to the un-poled copolymer, structural changes occur that include phase transformation, reduction in the conformational defects of crystallites and the orientation and alignment of all dipoles into the field direction. These changes occur in the first 10 to 15 minutes of the test. As the poling continues, impurities are transported to the electrodes. The time required for the complete pre-polarization varies depending on the degree of purification, i.e., the sample preparation conditions such as thermal and solution history.

If the electric field is switched off after 15 minutes and the copolymer is cooled immediately, all the crystallite dipoles will remain frozen in the field direction, resulting in remnant polarization. Complete pre-polarization, as a sum of crystalline changes and polling of impurities, is much longer for unpurified film than that for the samples previously subjected to cleaning and thermal treatment.

Figure 6:
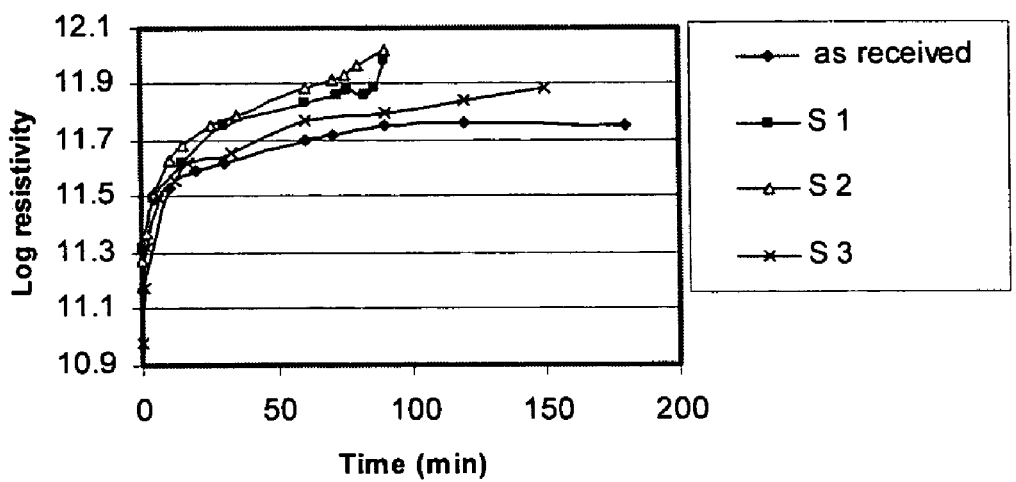
FIG. 6 is a graph of pre-polarization time vs. Log (ρf) at constant 25 MV/m of unpurified and three samples of purified copolymers.

FIG. 6 shows the copolymer resistivity as a function of pre-polarization time. It is evident that purification and pre-polarization under a slightly elevated temperature increase the copolymer resistivities. After 90 minutes of pre-polarization the resistivity of the unpurified film no longer increases, which indicates that the internal electrical conduction also does not decrease after this point. However, as the pre-polarization procedure continues, the resistivity of the purified films (S1, S2 and S3) continues to increase. When compared at the 90 minute mark the purified films S1, S2 and S3 have higher resistivity than the unpurified film by about 30%, 40% and 9% respectively.

Thus, purification of the P(VDF-TrFE) copolymer by the solvent extraction of the present invention not only improves electrical resistivity, but also makes the step of pre-conditioning of pyroelectric copolymer simplified and more effective. This is a key technology for developing a high performance pyroelectric converter system.

The high performance copolymer has uses in industries such as electric power generating stations, petro-chemical companies, steel works, and the pulp and paper industry.

It will be appreciated by one skilled in the art that variants can exist in the above-described procedure. For example, the amount of air-drying in an oven can be varied, which will vary the length of time required for air-drying at room temperature. In addition, one could replace ethanol with other polar alcohols such as methanol, propanol and higher alcohols. When methanol is used, water should be added to cause P(VDF-TrFE) precipitation from the alcohol/MEK mixture. Similarly, methyl ethyl ketone (MEK) could be replaced by N-N-dimethyl formamide (DMF). As another example, other common methods of separation of the solvent from the gel may also be employed.

What is claimed is:

1. A process for purifying a P(VDF-TrFE) copolymer for pyroelectric conversion comprising the steps of:
   obtaining pellets of P(VDF-TrFE) copolymer;
   dissolving the pellets in a solvent to form a solution;
   adding anhydrous ethanol to the solution to initiate copolymer gel precipitation;
   separating the solution and the gel precipitate;
   washing the gel precipitate with ethanol; and
   drying the gel precipitate.

2. The process of claim 1 wherein the solvent is methyl ethyl ketone.

3. The process of claim 2 wherein the solution and gel precipitate are separated by filtering.

4. The process of claim 2 wherein the gel precipitate has reduced polarization time.

5. The process of claim 2 wherein the step of drying the gel precipitate involves air-drying.

6. A purified copolymer when made by the process of claim 1.

7. A purified copolymer when made by the process of any one of claims 2 to 5.

* * * * *